United States Patent
Arceo et al.

(10) Patent No.: US 7,719,384 B1
(45) Date of Patent: May 18, 2010

(54) BROADBAND CHANNELIZED CIRCULATOR

(75) Inventors: Diana Arceo, San Diego, CA (US);
John W. Rockway, San Diego, CA (US); Jeffery C. Allen, San Diego, CA (US); Jeffery Young, Moscow, ID (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 128 days.

(21) Appl. No.: 12/237,592

(22) Filed: Sep. 25, 2008

(51) Int. Cl.
*H03H 7/01* (2006.01)
*H01P 1/32* (2006.01)

(52) U.S. Cl. ...................... 333/132; 333/1.1
(58) Field of Classification Search .............. 333/1.1, 333/24.2, 1, 100, 132, 136, 134; 455/188.1, 455/179.1, 180.1, 187.1
See application file for complete search history.

(56) References Cited

U.S. PATENT DOCUMENTS

| | | | |
|---|---|---|---|
| 3,700,832 A | 10/1972 | Beurrier | |
| 5,408,690 A * | 4/1995 | Ishikawa et al. | 455/115.4 |
| 6,107,898 A | 8/2000 | Rauscher | |
| 6,211,732 B1 | 4/2001 | Maiuzzo et al. | |
| 6,374,094 B1 * | 4/2002 | Zappala | 455/188.1 |
| 6,549,560 B1 | 4/2003 | Maiuzzo et al. | |
| 6,567,648 B1 | 5/2003 | Ahn et al. | |
| 6,853,235 B2 * | 2/2005 | Nakayama et al. | 327/379 |
| 7,031,749 B1 * | 4/2006 | Mitama | 455/556.1 |
| 7,348,867 B2 * | 3/2008 | Hattori | 333/186 |

* cited by examiner

*Primary Examiner*—Stephen E Jones
(74) *Attorney, Agent, or Firm*—Ryan J. Friedl; Kyle Eppele

(57) ABSTRACT

A system includes more than one subsystem, each subsystem operating within a different subsystem frequency range, the subsystems comprising a circulator having three or more circulator ports and a direction of circulation, the circulator operating within a specific frequency range of the subsystem frequency range, and a filter, such as a bandpass filter, connected to at least one of the circulator ports. The filters each define a subsystem port and operate within the specific frequency range. Each subsystem port has a port index determined by the direction of circulation of the circulator within the subsystem. Each subsystem port has a specific port index that is connected to a common port having the specific port index. At least one of the circulator ports may be terminated to a matched load. Each subsystem circulator may comprise at least three circulator ports, with a filter connected to each of the circulator ports.

20 Claims, 5 Drawing Sheets

US 7,719,384 B1

BROADBAND CHANNELIZED CIRCULATOR

FEDERALLY SPONSORED RESEARCH AND DEVELOPMENT

The Broadband Channelized Circulator is assigned to the United States Government and is available for licensing for commercial purposes. Licensing and technical inquiries may be directed to the Office of Research and Technical Applications, Space and Naval Warfare Systems Center, San Diego, Code 2112, San Diego, Calif., 92152; voice (619) 553-2778; email T2@spawar.navy.mil. Reference Navy Case No. 98665.

BACKGROUND

A circulator is a ferromagnetic three-port electrical device that controls the direction of the signal flow around the ports. Currently available circulators are limited in bandwidth because of the ferrite material used and the limitations of the associated matching networks. There are currently no broadband circulators. A broadband circulator is highly desirable for, among other applications, applications requiring broadband communications using a single antenna for both transmit and receive functions.

DETAILED DESCRIPTION OF SOME EMBODIMENTS

Figure 1:
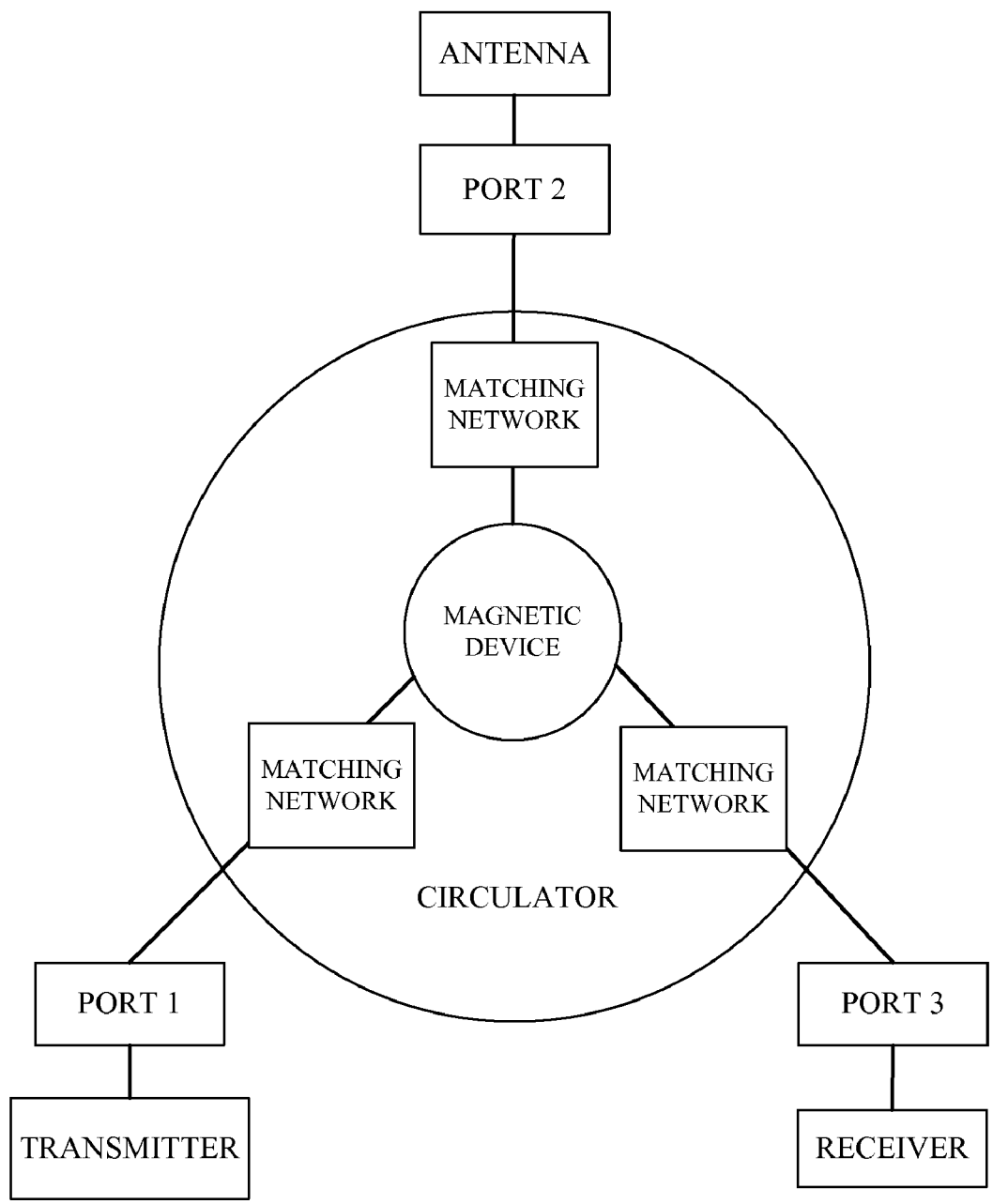
FIG. 1 shows a diagram of three-port circulator connected to an antenna, a transmitter, and a receiver.

FIG. 1 shows a diagram of a three-port circulator. The circulator contains a device using magnetized material and matching networks to connect the circulator to a first, second, and third port. The first port is connected to a transmitter, the second port is connected to an antenna, and the third port is connected to a receiver. The device using magnetized material controls the signal flow. The matching networks match the impedance of the circulator to the impedance of the device attached to each of the ports. For clockwise circulators, the signal will flow from Port 1 to Port 2, from Port 2 to Port 3, and from Port 3 to Port 1. Isolation will exist from Port 1 to 3, Port 2 to 1, and Port 3 to 2.

Traditional circulators are narrowband devices (i.e. devices operating between 1% to 5% bandwidth) due to the limitations of the materials used and the associated matching networks. Commercial off-the-shelf narrowband circulators cannot simply be connected in parallel to form a broadband circulator, as each circulator's impedance would detune the other circulators within the system.

Figure 2:
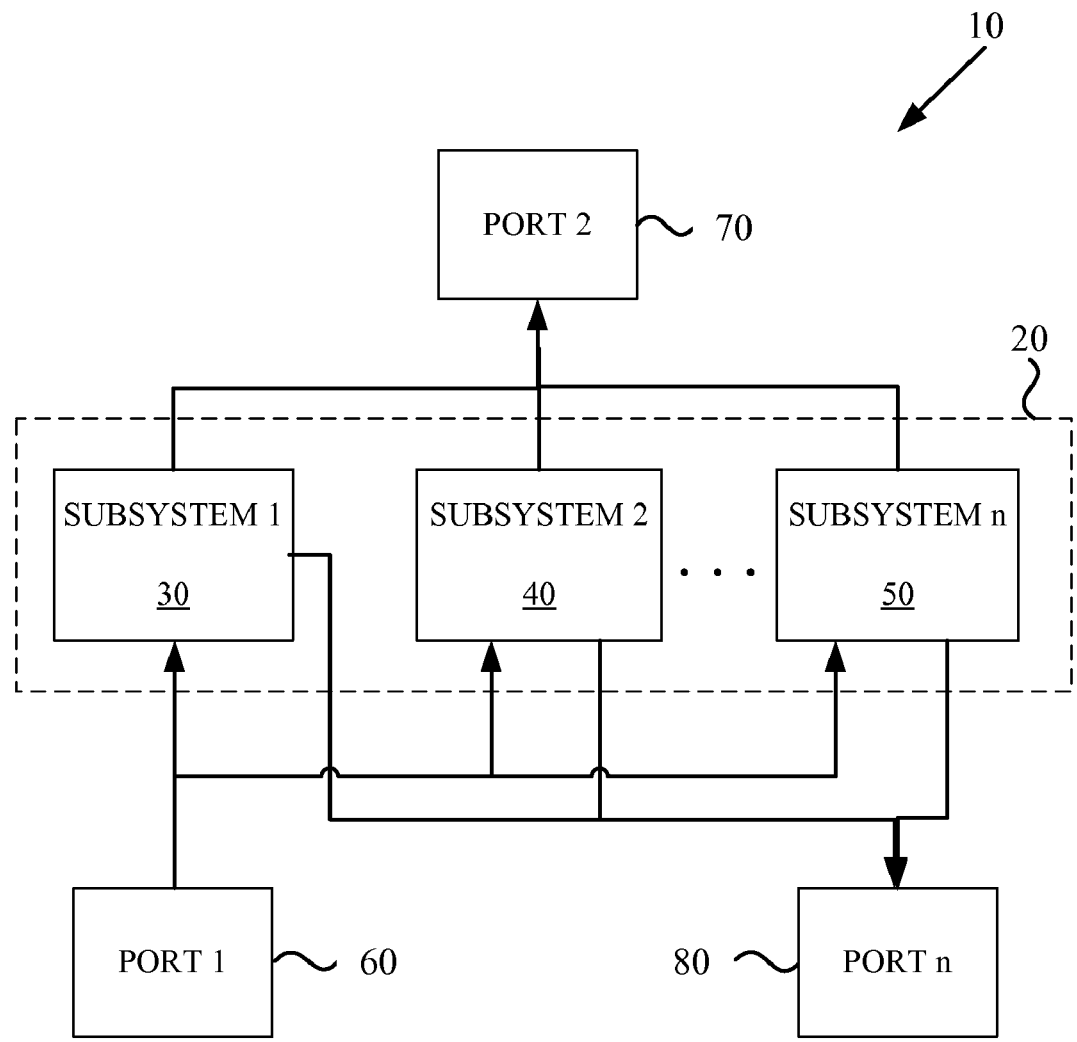
FIG. 2 shows a diagram of a system utilizing an n-port broadband channelized circulator in accordance with one embodiment of the Broadband Channelized Circulator.

FIG. 2 shows a diagram of a system 10 utilizing an n-port broadband channelized circulator 20, in accordance with one embodiment of the Broadband Channelized Circulator. System 10 may include broadband channelized circulator 20, a first port 60, a second port 70, and an n-port 80. Broadband channelized circulator 20 includes more than one subsystem. As shown in FIG. 2, broadband channelized circulator 20 includes a first subsystem 30, a second subsystem 40, and an $n^{th}$ subsystem 50. As an example, n may be any positive integer greater than one. The number of subsystems n may vary depending upon factors such as the particular application for which broadband channelized circulator 20 is used and the desired frequency range to be covered by broadband channelized circulator 20. Each subsystem may also contain n-ports. In an example where n is greater than two, each subsystem first port is connected to the first port 60. Each subsystem second port is connected to the second port 70. Each subsystem nth port is connected to the nth port 80.

Figure 3:
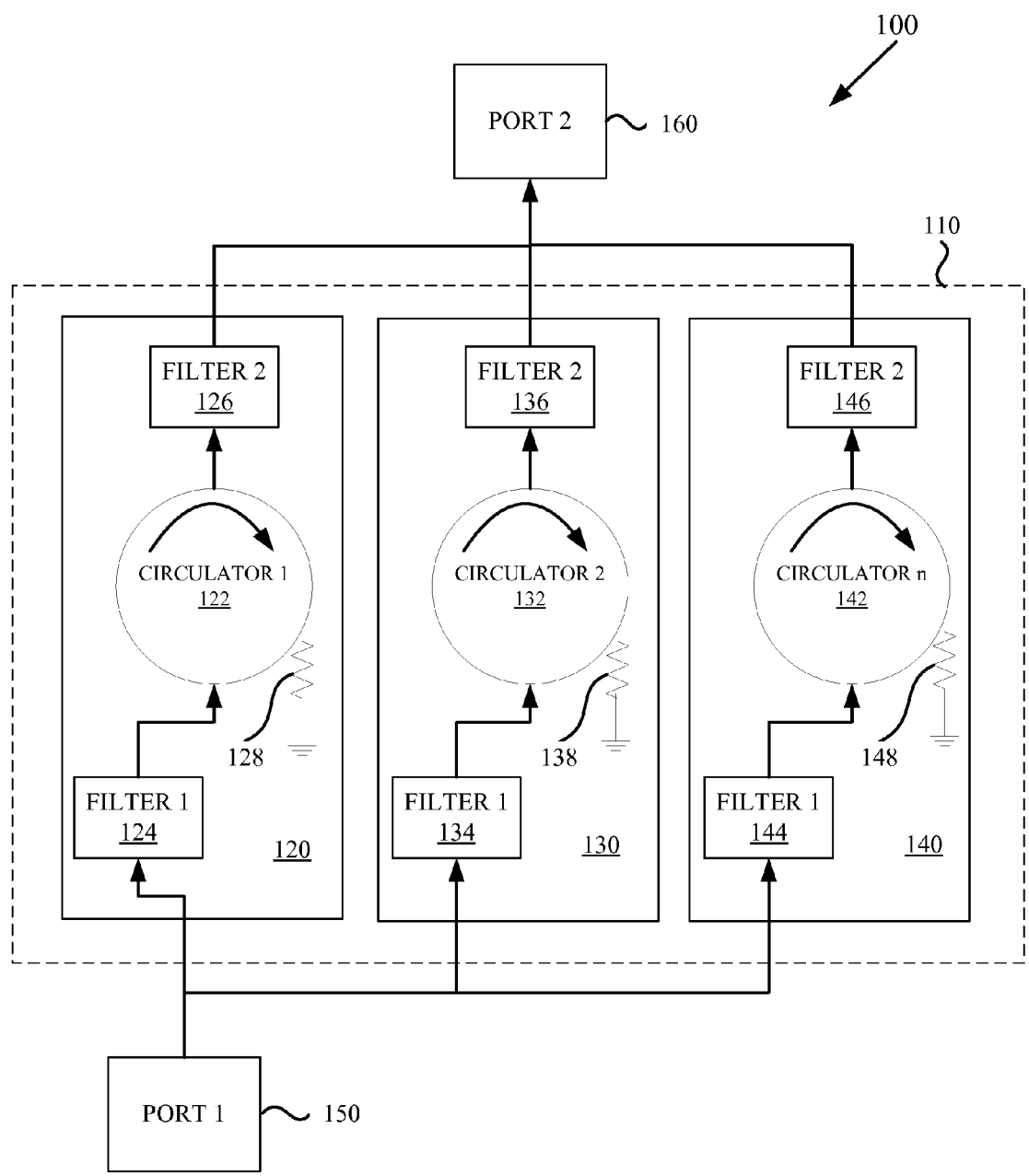
FIG. 3 shows a diagram of a system utilizing a two-port broadband channelized circulator in an isolator configuration, in accordance with one embodiment of the Broadband Channelized Circulator.

FIG. 3 shows a diagram of a system 100 utilizing a two-port broadband channelized circulator 110, in accordance with one embodiment of the Broadband Channelized Circulator. Broadband channelized circulator 110 is connected to a first port 150, which may be connected to a transmitter, and a second port 160, which may be connected to an antenna. Broadband channelized circulator 110 includes a first subsystem 120, a second subsystem 130, and an $n^{th}$ subsystem 140. Subsystems 120, 130, and 140 may each operate within a different frequency range within the total operating band of broadband channelized circulator 110. As an example, if broadband channelized circulator 110 operates within the band of 30 MHz to 90 MHz, subsystem 120 may operate within the range of 30 MHz to 50 MHz, subsystem 130 may operate within the range of 51 MHz to 70 MHz, and subsystem 140 may operate within the range of 71 MHz to 90 MHz.

In some embodiments, each subsystem may be comprised of similar components configured for operation within different frequency ranges. Subsystem 120 may include a circulator 122 having three or more circulator ports. A first circulator port may be connected to a first filter 124, a second circulator port may be connected to a second filter 126, while a third circulator port may be terminated to a matched load 128. Circulator 122 includes a direction of circulation indicated by the arrow. Similarly, subsystem 130 may include a circulator 132 having three or more circulator ports. A first circulator port may be connected to a first filter 134, a second circulator port may be connected to a second filter 136, while a third circulator port may be terminated to a matched load 138. Circulator 132 includes a direction of circulation indicated by the arrow. Likewise, subsystem 140 may include a circulator 142 having three or more circulator ports. A first circulator port may be connected to a first filter 144, a second circulator port may be connected to a second filter 146, while a third circulator port may be terminated to a matched load 148. Circulator 142 includes a direction of circulation indicated by the arrow.

Each subsystem circulator operates within the specific frequency range of the subsystem it is located within. For example, if subsystem 140 operates within the 71 MHz to 90 MHz range, circulator 142 operates within the 71 MHz to 90 MHz range.

The filters within broadband circulator 110, such as filters 124, 134, and 144, may comprise various types of bandpass filters. In some embodiments, the bandpass filters may comprise stripline filters. In other embodiments, the bandpass filters may comprise surface wave acoustic filters. In some embodiments, the subsystems may include more than one type of filter. Each subsystem filter operates within the specific frequency range of the subsystem it is located within. For example, if subsystem 140 operates within the 71 MHz to 90 MHz range, filters 144 and 146 operate within the 71 MHz to 90 MHz range.

Each of the filters within the subsystems define a subsystem port. For example, subsystem 130 contains two ports—a first port at filter 134 and a second port at filter 136. If broadband channelized circulator 110 is connected to ports within system 100, each port of subsystem 130 may be connected to a port within system 100. In such a configuration, each subsystem port has a port index determined by the direction of circulation of the circulator within the subsystem. As an example, if circulator 122 has a clockwise direction of circulation, a first subsystem port may be given an index of "one", the next subsystem port encountered in a clockwise rotation may be given an index of "two", and the next subsystem port encountered in a clockwise rotation may be given an index of "three", and so on. Indexing may be performed by various methods, as recognized by one having ordinary skill in the art.

Each subsystem port having a specific port index is connected to a "common" port having the same specific port index. For example, as shown in FIG. 3, first subsystem port defined by first filter 124, first subsystem port defined by first filter 134, and first subsystem port defined by first filter 144 are all connected to first "common" port 150. Further, second subsystem port defined by second filter 126, second subsystem port defined by second filter 136, and second subsystem port defined by second filter 146 are all connected to second "common" port 160. These "common" ports are the ports of the Broadband Channelized Circulator. In FIG. 2, these "common" ports are ports 60, 70, and 80.

As shown, at least one subsystem of broadband channelized circulator 110 is in an isolator configuration. In such a configuration, one port of a circulator is terminated in a matched load. For example, in subsystem 120, a third port of circulator 122 is terminated in matched load 128. A matched load has an impedance value that results in maximum absorption of power out of the specific circulator port. There is maximum power transfer and minimum reflection from the load. In most cases the matched load is a resistor.

Figure 4:
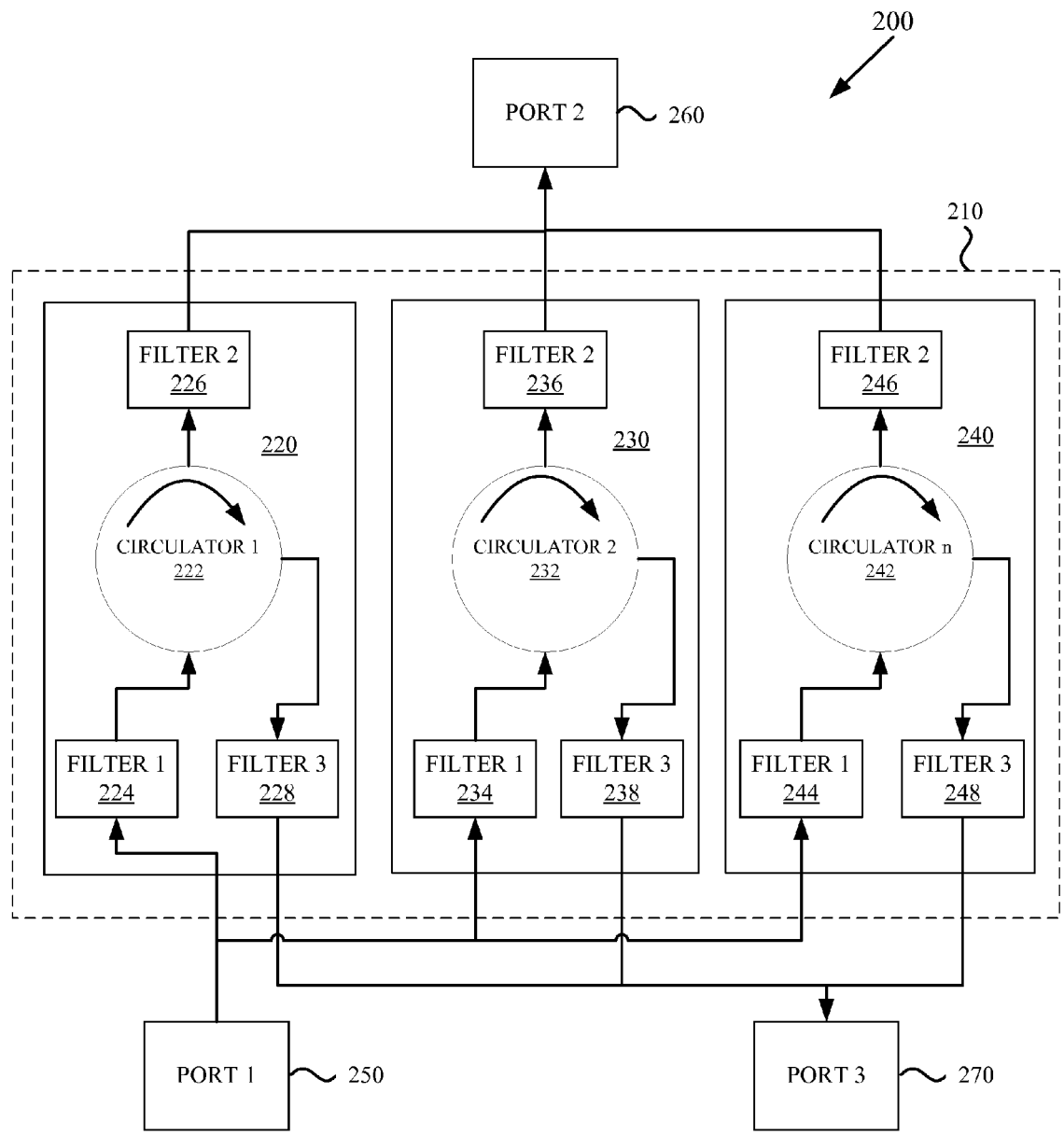
FIG. 4 shows a diagram of system utilizing a three-port broadband channelized circulator in a duplexer configuration, in accordance with one embodiment of the Broadband Channelized Circulator.

FIG. 4 shows a diagram of a system 200 utilizing a three-port broadband channelized circulator 210, in accordance with one embodiment of the Broadband Channelized Circulator. As shown, broadband channelized circulator 210 is connected to a first port 250, which may be connected to a transmitter, a second port 260, which may be connected to an antenna, and a third port 270, which may be connected to a receiver. Broadband channelized circulator 210 includes a first subsystem 220, a second subsystem 230, and an n$^{th}$ subsystem 240, where n may be any positive integer greater than two. In other embodiments, the broadband channelized circulator may include only two subsystems. Subsystems 220, 230, and 240 may each operate within a different frequency range within the total operating band of broadband channelized circulator 210. As an example, if broadband channelized circulator 210 operates within the band of 30 MHz to 90 MHz, subsystem 220 may operate within the range of 30 MHz to 50 MHz, subsystem 230 may operate within the range of 51 MHz to 70 MHz, and subsystem 240 may operate within the range of 71 MHz to 90 MHz.

In some embodiments, each subsystem may be comprised of similar components configured for operation within different frequency ranges. For example, subsystem 220 may include a circulator 222 having three or more circulator ports. A first circulator port may be connected to a first filter 224, a second circulator port may be connected to a second filter 226, while a third circulator port may be connected to a third filter 228. Circulator 222 includes a direction of circulation indicated by the arrow. Subsystems 230 and 240 may contain similar components as subsystem 220. Each subsystem circulator may operate within the specific frequency range of the subsystem it is located within. For example, if subsystem 240 operates within the 71 MHz to 90 MHz range, circulator 242 will operate within the 71 MHz to 90 MHz range.

The filters within broadband circulator 210, such as filters 224, 234, and 244, may comprise various types of bandpass filters. In some embodiments, the bandpass filters may comprise stripline filters. In other embodiments, the bandpass filters may comprise surface wave acoustic filters. In some embodiments, the subsystems may include more than one type of filter. Each subsystem filter operates within the specific frequency range of the subsystem it is located within. For example, if subsystem 240 operates within the 71 MHz to 90 MHz range, filters 244, 246, and 248 operate within the 71 MHz to 90 MHz range.

Each of the filters within the subsystems define a subsystem port. For example, subsystem 230 contains three ports—a first port at filter 234, a second port at filter 236, and a third port at filter 238. If broadband channelized circulator 210 is connected to ports within system 200, each port of subsystem 230 may be connected to a port within system 200. In such a configuration, each subsystem port has a port index determined by the direction of circulation of the circulator within the subsystem. As an example, if circulator 222 has a clockwise direction of circulation, a first subsystem port may be given an index of "one", the next subsystem port encountered in a clockwise rotation may be given an index of "two", and so on.

Each subsystem port having a specific port index is connected to a "common" port having the same specific port index. For example, as shown in FIG. 4, first subsystem port defined by first filter 224, first subsystem port defined by first filter 234, and first subsystem port defined by first filter 244 are all connected to first "common" port 250. Likewise, second subsystem port defined by second filter 226, second subsystem port defined by second filter 236, and second subsystem port defined by second filter 246 are all connected to second "common" port 260. These "common" ports are the ports of the broadband channelized circulator. In FIG. 2, these "common" ports are ports 60, 70, and 80.

As shown, the subsystems of broadband channelized circulator 210 are in a duplexer configuration. In such a configuration, at least three ports of a circulator are connected to filters that are connected to common ports. For example, in subsystem 220, a first circulator port is connected to first filter 224, a second circulator port is connected to a second filter 226, and a third circulator port is connected to a third filter 228.

In some embodiments, broadband channelized circulator 210 may be configured as a combination isolator/duplexer. In such embodiments, at least one of the subsystems comprises a circulator having three circulator ports connected to filters, while at least one of the other subsystems contains a circulator having one circulator port terminated in a matched load. Such an embodiment may be depicted by a combination of broadband channelized circulator 110 as shown in FIG. 3 with broadband channelized circulator 210 as shown in FIG. 4.

Figure 5:
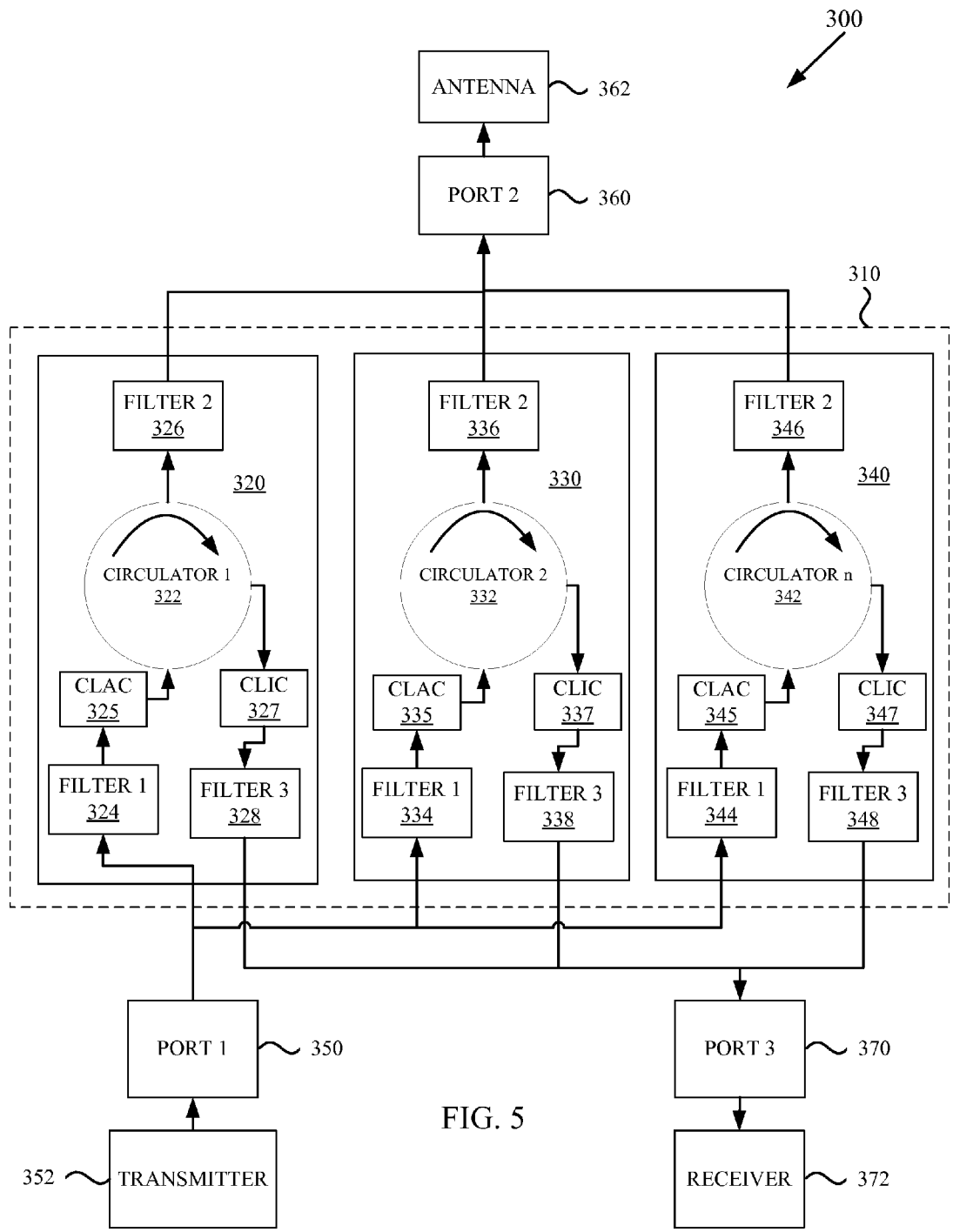
FIG. 5 shows a diagram of system utilizing a three-port broadband channelized circulator in a duplexer configuration, including a comb linear amplifier combiner and a comb limiter combiner within each subsystem, in accordance with one embodiment of the Broadband Channelized Circulator.

FIG. 5 shows a diagram of a system 300 utilizing a three-port broadband channelized circulator 310, in accordance with one embodiment of the Broadband Channelized Circulator. As shown, broadband channelized circulator 310 is connected to a first port 350, which is connected to a transmitter 352, a second port 360, which is connected to an antenna 362, and a third port 370, which is connected to a receiver 372. In some embodiments, first port 350 is connected to a transmitter subsystem, while third port 370 is connected to a receiver subsystem. Broadband channelized circulator 310 includes a first subsystem 320, a second subsystem 330, and an n$^{th}$ subsystem 340, where broadband channelized circulator 310 includes a number of subsystems from 1 to n, where n may be any positive integer greater than two. In other embodiments, the broadband channelized circulator may include only two subsystems.

Subsystems 320, 330, and 340 may each operate within a different frequency range within the total operating band of broadband channelized circulator 310. As an example, if broadband channelized circulator 310 operates within the band of 30 MHz to 90 MHz, subsystem 320 may operate within the range of 30 MHz to 50 MHz, subsystem 330 may operate within the range of 51 MHz to 70 MHz, and subsystem 340 may operate within the range of 71 MHz to 90 MHz.

In some embodiments, each subsystem may be comprised of similar components configured for operation within different frequency ranges. For example, subsystem 320 may include a circulator 322 having three or more circulator ports. Circulator 322 includes a direction of circulation indicated by the arrow. A first circulator port may be connected to a comb linear amplifier combiner (CLAC) 325, a second circulator port may be connected to a second filter 326, while a third circulator port may be connected to a comb limiter combiner (CLIC) 327. CLAC 325 and CLIC 327 operate within the same frequency range as the circulator within the subsystem. The structure and operation of CLAC 325 is described in U.S. Pat. No. 6,211,732 to Maiuzzo et al., the content of which is fully incorporated by reference herein. The structure and operation of CLIC 327 is described in U.S. Pat. No. 6,549,560 to Maiuzzo et al., the content of which is fully incorporated by reference herein. The addition of CLAC 325 to broadband channelized circulator 310 serves to minimize the effect of transmitter generated intermodulation, as well as the potential for this intermodulation to decrease the ability to receive weak signals. The addition of CLIC 327 broadband channelized circulator 310 serves to protect RF nonlinear components, such as amplifiers and limiters, from high-level, off-tuned interference.

In some embodiments of system 300, rather than CLAC 325 and CLIC 327 being located within subsystem 320, a CLAC component is connected to first port 350, while a CLIC component is connected to third port 370. In such embodiments, CLAC and CLIC operate within the frequency range of the combined subsystems of the broadband channelized circulator. The use of CLAC 325 and CLIC 327 within each subsystem of broadband channelized circulator 310 however, allows for a broadband channelized circulator with increased performance. Current CLAC and CLIC designs are generally limited to sixteen sub-bands due to the interaction between sub-bands. If more than sixteen sub-bands exist for each CLIC and CLAC, It is difficult for designers to accommodate the inter-sub-band interaction. It is desirable to have more than sixteen sub-bands for broadband applications. For example, in CLIC, degradation is confined to infrequent periods when the desired signal is in the same sub-band as an undesired signal. With a sufficient number of sub-bands, the probability of this occurring will be small and the data error rates will be acceptable.

To illustrate, in an embodiment of system 300, operating at a frequency range of 30 MHz to 500 MHz, where a CLAC component is connected to first port 350 and a CLIC component is connected to third port 370, the CLAC/CLIC design limitation of sixteen sub-bands causes each CLAC/CLIC sub-band to operate over about a 30 MHz range. If interference exists in one of the sub-bands, causing loss of use of a sub-band, severe signal degradation may occur. On the other hand, in an embodiment of system 300, operating at the same frequency range, including a CLAC component and a CLIC component within each subsystem, signal degradation is less likely. As an example, if system 300 includes three subsystems, each with a CLIC component and a CLAC component having sixteen sub-bands, the total number of CLIC and CLAC sub-bands for system 300 would be forty-eight. Thus, the entire frequency range of 470 MHz would be divided between forty-eight sub-bands, equaling roughly of frequency range of 10 MHz per CLIC/CLAC sub-band. If a particular sub-band is lost due to interference, only a 10 MHz frequency range is lost, rather than losing a 30 MHz frequency range as in the other embodiment of system 300.

In some embodiments, CLAC 325 is connected directly to a circulator port and to a first filter 324, while CLIC 327 is connected directly to a circulator port and to a third filter 328. In other embodiments, first filter 324 is connected directly to a circulator port and CLAC 325 is connected to first filter 324, while third filter 328 is connected directly to a circulator port and CLIC 327 is connected to third filter 328. In such embodiments, CLAC 325 and CLIC 327 would define subsystem ports.

Subsystems 330 and 340 may contain similar components as subsystem 320. Each subsystem circulator may operate within the specific frequency range of the subsystem it is located within. For example, if subsystem 340 operates within the 71 MHz to 90 MHz range, circulator 342 will operate within the 71 MHz to 90 MHz range.

The filters within broadband circulator 310, such as filters 324, 334, and 344, may comprise various types of filters, such as bandpass filters. In some embodiments, each subsystem may include more than one type of filter. In some embodiments, different subsystems may include different types of filters. Each subsystem filter operates within the specific frequency range of the subsystem it is located within. For example, if subsystem 340 operates within the 71 MHz to 90 MHz range, filters 344, 346, and 348 operate within the 71 MHz to 90 MHz range.

Each of the filters within the subsystems defines a subsystem port. For example, subsystem 330 contains three ports—a first port at filter 334, a second port at filter 336, and a third port at filter 338. If broadband channelized circulator 310 is connected to ports within system 300, each port of subsystem 330 may be connected to a port within system 300. In such a configuration, each subsystem port has a port index determined by the direction of circulation of the circulator within the subsystem. As an example, if circulator 322 has a clockwise direction of circulation, a first subsystem port may be given an index of "one", the next subsystem port encountered in a clockwise rotation may be given an index of "two", and so on.

Each subsystem port having a specific port index is connected to a "common" port having the same specific port index. For example, as shown in FIG. 5, first subsystem port defined by first filter 324, first subsystem port defined by first filter 334, and first subsystem port defined by first filter 344 are all connected to first "common" port 350. Likewise, second subsystem port defined by second filter 326, second subsystem port defined by second filter 336, and second subsystem port defined by second filter 346 are all connected to second "common" port 360. These "common" ports are the ports of the broadband channelized circulator. In FIG. 5, these "common" ports are ports 350, 360, and 370.

As shown, the subsystems of broadband channelized circulator 310 are in a duplexer configuration. In such a configuration, at least three ports of a circulator are connected to filters that are connected to common ports. For example, in subsystem 320, a first circulator port is connected to first filter 324, a second circulator port is connected to a second filter 326, and a third circulator port is connected to a third filter 328.

In some embodiments, broadband channelized circulator 310 may be configured as a combination isolator/duplexer. In such embodiments, at least one of the subsystems comprises a circulator having three circulator ports connected to filters, while at least one of the other subsystems contains a circulator having one circulator port terminated in a matched load. Such an embodiment may be depicted by a combination of broadband channelized circulator 110 as shown in FIG. 3 with broadband channelized circulator 310 as shown in FIG. 5.

Broadband channelized circulators 10, 110, 210, and 310 may operate within various frequency bands. For example, circulators 10, 110, 210, and 310 may operate within the Very High Frequency (VHF) band and/or the Ultra High Frequency (UHF) band. In other embodiments, circulators 10, 110, 210, and 310 may operate across multiple frequency bands. In such embodiments, each subsystem within circulators 10, 110, 210, and 310 may operate within the same, or a different, frequency band. Channelized Broadband Circulators 10, 110, 210, and 310 may achieve signal circulation over bandwidths in excess of 10% of the operating frequency.

Many modifications and variations of the Broadband Channelized Circulator are possible in light of the above description. Within the scope of the appended claims, the Broadband Channelized Circulator may be practiced otherwise than as specifically described. Further, the scope of the claims is not limited to the implementations and embodiments disclosed herein, but extends to other implementations and embodiments as may be contemplated by those having ordinary skill in the art.

We claim:

1. A system comprising:
   more than one subsystem, wherein each subsystem operates within a different subsystem frequency range, the subsystems comprising
      a circulator having three or more circulator ports and a direction of circulation, the circulator operating within a specific frequency range of the subsystem frequency range, and
      a filter connected to at least one of the circulator ports, the filter defining a subsystem port, wherein the filter operates within the specific frequency range
   wherein each subsystem port has a port index determined by the direction of circulation of the circulator within the subsystem
   wherein each subsystem port having a specific port index is connected to a common port having the specific port index.

2. The system of claim 1, wherein the filters are band-pass filters.

3. The system of claim 1, wherein, for each subsystem, at least one of the circulator ports is terminated to a matched load.

4. The system of claim 1, wherein, for each subsystem, the circulator comprises at least three circulator ports and a filter is connected to each of the circulator ports.

5. The system of claim 1, wherein each of the subsystems operate within the very high frequency (VHF) band.

6. The system of claim 1, wherein each of the subsystems operate within the ultra high frequency (UHF) band.

7. The system of claim 1, wherein the common ports comprise a first common port, a second common port, and a third common port, wherein a first filter for each subsystem is connected to the first common port, wherein the first common port is connected to a transmit subsystem.

8. The system of claim 7, wherein a second filter for each subsystem is connected to the second common port, wherein the second common port is connected to a receive subsystem.

9. The system of claim 8, wherein the third common port is connected to an antenna.

10. The system of claim 1, wherein the subsystems further comprise a comb limiter combiner (CLIC) connected to at least one of the circulator ports, wherein the CLIC operates within the specific frequency range.

11. The system of claim 10, wherein the CLIC is connected to a circulator port having the filter connected thereto.

12. The system of claim 11, wherein the CLIC is connected between the circulator port and the filter.

13. The system of claim 1, wherein the subsystems further comprise a comb linear amplifier combiner (CLAC) connected to at least one of the circulator ports, wherein the CLAC operates within the specific frequency range.

14. The system of claim 13, wherein the CLAC is connected to a circulator port having the filter connected thereto.

15. The system of claim 14, wherein the CLAC is connected between the circulator port and the filter.

16. The system of claim 1, wherein the subsystems further comprise a CLIC connected to at least one of the circulator ports and a CLAC connected to at least another of the circulator ports.

17. A system comprising:
   more than one subsystem, wherein each subsystem operates within a different subsystem frequency range, the subsystems comprising
      a circulator having three or more circulator ports and a direction of circulation, the circulator operating within a specific frequency range of the subsystem frequency range, and
      a filter connected to at least one of the circulator ports, the filter defining a subsystem port, wherein the filter operates within the specific frequency range
      a comb limiter combiner (CLIC) connected to at least one of the circulator ports, wherein the CLIC operates within the specific frequency range, and
      a comb linear amplifier combiner (CLAC) connected to at least one of the circulator ports, wherein the CLAC operates within the specific frequency range
   wherein each subsystem port has a port index determined by the direction of circulation of the circulator within the subsystem
   wherein each subsystem port having a specific port index is connected to a common port having the specific port index.

18. The system of claim 17, wherein, for each subsystem, at least one of the circulator ports is terminated to a matched load.

19. The system of claim 17, wherein, for each subsystem, the circulator comprises at least three circulator ports and a filter is connected to each of the circulator ports.

20. The system of claim 17, wherein the common ports comprise a first common port, a second common port, and a third common port, wherein a first filter for each subsystem is connected to the first common port, the first common port connected to a transmit subsystem, wherein a second filter for each subsystem is connected to the second common port, the second common port connected to a receive subsystem, and wherein a third filter for each subsystem is connected to the third common port, the third common port connected to an antenna.

* * * * *